United States Patent
Uzoh et al.

(10) Patent No.: US 11,855,064 B2
(45) Date of Patent: *Dec. 26, 2023

(54) TECHNIQUES FOR PROCESSING DEVICES

(71) Applicant: ADEIA SEMICONDUCTOR BONDING TECHNOLOGIES INC., San Jose, CA (US)

(72) Inventors: Cyprian Emeka Uzoh, San Jose, CA (US); Laura Wills Mirkarimi, Sunol, CA (US); Guilian Gao, San Jose, CA (US); Gaius Gillman Fountain, Jr., Youngsville, NC (US)

(73) Assignee: ADEIA SEMICONDUCTOR BONDING TECHNOLOGIES INC., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/344,100

(22) Filed: Jun. 10, 2021

(65) Prior Publication Data

US 2021/0375850 A1 Dec. 2, 2021

Related U.S. Application Data

(63) Continuation of application No. 16/919,989, filed on Jul. 2, 2020, now Pat. No. 11,037,919, which is a (Continued)

(51) Int. Cl.
*H01L 25/00* (2006.01)
*H01L 25/065* (2023.01)
(Continued)

(52) U.S. Cl.
CPC ............ *H01L 25/50* (2013.01); *H01L 21/187* (2013.01); *H01L 21/6836* (2013.01);
(Continued)

(58) Field of Classification Search
CPC ... H01L 21/187; H01L 21/6836; H01L 21/78; H01L 24/27; H01L 24/30; H01L 24/83; H01L 25/0657; H01L 25/50
See application file for complete search history.

(56) References Cited

U.S. PATENT DOCUMENTS 5,051,802 A 9/1991 Prost et al.
5,753,536 A 5/1998 Sugiyama et al.
(Continued)

FOREIGN PATENT DOCUMENTS

CN 104246971 A 12/2014
CN 106409650 A 2/2017
(Continued)

OTHER PUBLICATIONS

Inoue, F. et al., "Influence of composition of SiCN as interfacial layer on plasma activated direct bonding," ECS Journal of Solid State Science and Technology, 2019, vol. 8, No. 6, pp. P346-P350.
(Continued)

*Primary Examiner* — Brook Kebede
(74) *Attorney, Agent, or Firm* — Knobbe, Martens, Olson & Bear, LLP

(57) ABSTRACT

Representative techniques provide process steps for forming a microelectronic assembly, including preparing microelectronic components such as dies, wafers, substrates, and the like, for bonding. One or more surfaces of the microelectronic components are formed and prepared as bonding surfaces. The microelectronic components are stacked and bonded without adhesive at the prepared bonding surfaces.

32 Claims, 7 Drawing Sheets

Related U.S. Application Data continuation of application No. 16/262,489, filed on Jan. 30, 2019, now Pat. No. 10,727,219.

(60) Provisional application No. 62/631,216, filed on Feb. 15, 2018.

(51) Int. Cl.
    *H01L 23/00*         (2006.01)
    *H01L 21/78*         (2006.01)
    *H01L 21/683*       (2006.01)
    *H01L 21/18*         (2006.01)

(52) U.S. Cl.
CPC .............. *H01L 21/78* (2013.01); *H01L 24/27* (2013.01); *H01L 24/30* (2013.01); *H01L 24/83* (2013.01); *H01L 25/0657* (2013.01); *H01L 2224/83011* (2013.01); *H01L 2224/83013* (2013.01)

(56) References Cited

U.S. PATENT DOCUMENTS

| | | | |
|---|---|---|---|
| 5,771,555 | A | 6/1998 | Eda et al. |
| 6,080,640 | A | 6/2000 | Gardner et al. |
| 6,423,640 | B1 | 7/2002 | Lee et al. |
| 6,465,892 | B1 | 10/2002 | Suga |
| 6,887,769 | B2 | 5/2005 | Kellar et al. |
| 6,908,027 | B2 | 6/2005 | Tolchinsky et al. |
| 7,045,453 | B2 | 5/2006 | Canaperi et al. |
| 7,105,980 | B2 | 9/2006 | Abbott et al. |
| 7,193,423 | B1 | 3/2007 | Dalton et al. |
| 7,550,366 | B2 | 6/2009 | Suga et al. |
| 7,582,971 | B2 | 9/2009 | Kameyama et al. |
| 7,663,231 | B2 | 2/2010 | Chang et al. |
| 7,686,912 | B2 | 3/2010 | Suga et al. |
| 7,750,488 | B2 | 7/2010 | Patti et al. |
| 7,759,751 | B2 | 7/2010 | Ono |
| 7,803,693 | B2 | 9/2010 | Trezza |
| 7,906,410 | B2 | 3/2011 | Arita et al. |
| 8,168,458 | B2 | 5/2012 | Do et al. |
| 8,183,127 | B2 | 5/2012 | Patti et al. |
| 8,193,632 | B2 | 6/2012 | Chang et al. |
| 8,263,434 | B2 | 9/2012 | Pagaila et al. |
| 8,268,699 | B2 | 9/2012 | Park et al. |
| 8,318,586 | B2 | 11/2012 | Libralesso et al. |
| 8,349,635 | B1 | 1/2013 | Gan et al. |
| 8,377,798 | B2 | 2/2013 | Peng et al. |
| 8,441,131 | B2 | 5/2013 | Ryan |
| 8,476,165 | B2 | 7/2013 | Trickett et al. |
| 8,482,132 | B2 | 7/2013 | Yang et al. |
| 8,501,537 | B2 | 8/2013 | Sadaka et al. |
| 8,524,533 | B2 | 9/2013 | Tong et al. |
| 8,618,659 | B2 | 12/2013 | Sato et al. |
| 8,620,164 | B2 | 12/2013 | Heck et al. |
| 8,647,987 | B2 | 2/2014 | Yang et al. |
| 8,697,493 | B2 | 4/2014 | Sadaka |
| 8,716,105 | B2 | 5/2014 | Sadaka et al. |
| 8,791,575 | B2 | 7/2014 | Oganesian et al. |
| 8,802,538 | B1 | 8/2014 | Liu |
| 8,809,123 | B2 | 8/2014 | Liu et al. |
| 8,841,002 | B2 | 9/2014 | Tong |
| 8,866,305 | B2 | 10/2014 | Sadaka et al. |
| 8,878,353 | B2 | 11/2014 | Haba et al. |
| 9,018,079 | B1 | 4/2015 | Lei et al. |
| 9,093,350 | B2 | 7/2015 | Endo et al. |
| 9,136,293 | B2 | 9/2015 | Yee et al. |
| 9,142,459 | B1 | 9/2015 | Kumar et al. |
| 9,142,517 | B2 | 9/2015 | Liu et al. |
| 9,171,756 | B2 | 10/2015 | Enquist et al. |
| 9,184,125 | B2 | 11/2015 | Enquist et al. |
| 9,224,704 | B2 | 12/2015 | Landru |
| 9,230,941 | B2 | 1/2016 | Chen et al. |
| 9,252,172 | B2 | 2/2016 | Chow et al. |
| 9,257,399 | B2 | 2/2016 | Kuang et al. |
| 9,299,736 | B2 | 3/2016 | Chen et al. |
| 9,312,229 | B2 | 4/2016 | Chen et al. |
| 9,331,149 | B2 | 5/2016 | Tong et al. |
| 9,337,235 | B2 | 5/2016 | Chen et al. |
| 9,385,024 | B2 | 7/2016 | Tong et al. |
| 9,394,161 | B2 | 7/2016 | Cheng et al. |
| 9,431,368 | B2 | 8/2016 | Enquist et al. |
| 9,437,572 | B2 | 9/2016 | Chen et al. |
| 9,443,796 | B2 | 9/2016 | Chou et al. |
| 9,461,007 | B2 | 10/2016 | Chun et al. |
| 9,476,898 | B2 | 10/2016 | Takano |
| 9,496,239 | B1 | 11/2016 | Edelstein et al. |
| 9,536,848 | B2 | 1/2017 | England et al. |
| 9,559,081 | B1 | 1/2017 | Lai et al. |
| 9,620,481 | B2 | 4/2017 | Edelstein et al. |
| 9,656,852 | B2 | 5/2017 | Cheng et al. |
| 9,723,716 | B2 | 8/2017 | Meinhold |
| 9,728,521 | B2 | 8/2017 | Tsai et al. |
| 9,741,620 | B2 | 8/2017 | Uzoh et al. |
| 9,799,587 | B2 | 10/2017 | Fujii et al. |
| 9,852,988 | B2 | 12/2017 | Enquist et al. |
| 9,893,004 | B2 | 2/2018 | Yazdani |
| 9,929,050 | B2 | 3/2018 | Lin |
| 9,941,241 | B2 | 4/2018 | Edelstein et al. |
| 9,941,243 | B2 | 4/2018 | Kim et al. |
| 9,953,941 | B2 | 4/2018 | Enquist |
| 9,960,142 | B2 | 5/2018 | Chen et al. |
| 9,971,777 | B2 | 5/2018 | Bertin et al. |
| 10,002,844 | B1 | 6/2018 | Wang et al. |
| 10,026,605 | B2 | 7/2018 | Doub et al. |
| 10,075,657 | B2 | 9/2018 | Fahim et al. |
| 10,204,893 | B2 | 2/2019 | Uzoh et al. |
| 10,269,756 | B2 | 4/2019 | Uzoh |
| 10,269,853 | B2 | 4/2019 | Katkar et al. |
| 10,276,619 | B2 | 4/2019 | Kao et al. |
| 10,276,909 | B2 | 4/2019 | Huang et al. |
| 10,418,277 | B2 | 9/2019 | Cheng et al. |
| 10,446,456 | B2 | 10/2019 | Shen et al. |
| 10,446,487 | B2 | 10/2019 | Huang et al. |
| 10,446,532 | B2 | 10/2019 | Uzoh et al. |
| 10,508,030 | B2 | 12/2019 | Katkar et al. |
| 10,515,925 | B2 | 12/2019 | Uzoh |
| 10,522,499 | B2 | 12/2019 | Enquist et al. |
| 10,566,219 | B2 | 2/2020 | Kurita et al. |
| 10,707,087 | B2 | 7/2020 | Uzoh et al. |
| 10,714,449 | B2 | 7/2020 | Uzoh |
| 10,727,219 | B2 * | 7/2020 | Uzoh ..................... H01L 25/50 |
| 10,784,191 | B2 | 9/2020 | Huang et al. |
| 10,790,262 | B2 | 9/2020 | Uzoh et al. |
| 10,840,135 | B2 | 11/2020 | Uzoh |
| 10,840,205 | B2 | 11/2020 | Fountain, Jr. et al. |
| 10,854,578 | B2 | 12/2020 | Morein |
| 10,879,212 | B2 | 12/2020 | Uzoh et al. |
| 10,886,177 | B2 | 1/2021 | DeLaCruz et al. |
| 10,892,246 | B2 | 1/2021 | Uzoh |
| 10,923,408 | B2 | 2/2021 | Huang et al. |
| 10,923,413 | B2 | 2/2021 | DeLaCruz |
| 10,937,755 | B2 | 3/2021 | Shah et al. |
| 10,950,547 | B2 | 3/2021 | Mohammed et al. |
| 10,964,664 | B2 | 3/2021 | Mandalapu et al. |
| 10,985,133 | B2 | 4/2021 | Uzoh |
| 10,991,804 | B2 | 4/2021 | DeLaCruz et al. |
| 10,998,292 | B2 | 5/2021 | Lee et al. |
| 11,004,757 | B2 | 5/2021 | Katkar et al. |
| 11,011,494 | B2 | 5/2021 | Gao et al. |
| 11,011,503 | B2 | 5/2021 | Wang et al. |
| 11,031,285 | B2 | 6/2021 | Katkar et al. |
| 11,037,919 | B2 * | 6/2021 | Uzoh .................. H01L 21/6835 |
| 11,056,348 | B2 | 7/2021 | Theil |
| 11,069,734 | B2 | 7/2021 | Katkar |
| 11,088,099 | B2 | 8/2021 | Katkar et al. |
| 11,127,738 | B2 | 9/2021 | DeLaCruz et al. |
| 11,158,606 | B2 | 10/2021 | Gao et al. |
| 11,171,117 | B2 | 11/2021 | Gao et al. |
| 11,176,450 | B2 | 11/2021 | Teig et al. |
| 11,256,004 | B2 | 2/2022 | Haba et al. |
| 11,264,357 | B1 | 3/2022 | DeLaCruz et al. |
| 11,276,676 | B2 | 3/2022 | Enquist et al. |
| 11,329,034 | B2 | 5/2022 | Tao et al. |

(56) References Cited

U.S. PATENT DOCUMENTS

| | | | |
|---|---|---|---|
| 11,348,898 B2 | 5/2022 | DeLaCruz et al. |
| 11,355,443 B2 | 6/2022 | Huang et al. |
| 2002/0003307 A1 | 1/2002 | Suga |
| 2002/0048906 A1 | 4/2002 | Sakai et al. |
| 2002/0053730 A1 | 5/2002 | Mashino |
| 2004/0084414 A1 | 5/2004 | Sakai et al. |
| 2004/0235266 A1 | 11/2004 | Tong |
| 2005/0009246 A1 | 1/2005 | Enquist et al. |
| 2005/0031795 A1 | 2/2005 | Chaudhury et al. |
| 2006/0057945 A1 | 3/2006 | Hsu et al. |
| 2006/0087042 A1 | 4/2006 | Kameyama et al. |
| 2007/0075417 A1 | 4/2007 | Hwang et al. |
| 2007/0111386 A1 | 5/2007 | Kim et al. |
| 2007/0224733 A1 | 9/2007 | Boyle et al. |
| 2008/0308928 A1 | 12/2008 | Chang |
| 2009/0227089 A1* | 9/2009 | Plaut ............. C09J 5/00 438/464 |
| 2009/0298264 A1 | 12/2009 | Arai et al. |
| 2010/0167534 A1 | 7/2010 | Iwata |
| 2011/0175243 A1 | 7/2011 | Jo et al. |
| 2012/0187516 A1 | 7/2012 | Sato |
| 2012/0194719 A1 | 8/2012 | Churchwell et al. |
| 2013/0026643 A1 | 1/2013 | England et al. |
| 2013/0252399 A1 | 9/2013 | Leduc et al. |
| 2013/0270328 A1 | 10/2013 | Di Cioccio et al. |
| 2014/0001949 A1 | 1/2014 | Kimura et al. |
| 2014/0011324 A1 | 1/2014 | Liu et al. |
| 2014/0175655 A1 | 6/2014 | Chen et al. |
| 2014/0312511 A1* | 10/2014 | Nakamura ............. H01L 24/81 438/109 |
| 2014/0314370 A1 | 10/2014 | Hatori et al. |
| 2015/0064498 A1 | 3/2015 | Tong |
| 2015/0118825 A1 | 4/2015 | Ishizuka |
| 2015/0255349 A1 | 9/2015 | Holden et al. |
| 2015/0314385 A1 | 11/2015 | Abe et al. |
| 2016/0126218 A1 | 5/2016 | Kurita |
| 2016/0343682 A1 | 11/2016 | Kawasaki |
| 2018/0005977 A1 | 1/2018 | Lin et al. |
| 2018/0012787 A1 | 1/2018 | Oka et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0219038 A1 | 8/2018 | Gambino et al. |
| 2018/0308819 A1 | 10/2018 | Uzoh |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0096741 A1 | 3/2019 | Uzoh et al. |
| 2019/0115277 A1 | 4/2019 | Yu et al. |
| 2019/0131277 A1 | 5/2019 | Yang et al. |
| 2019/0157333 A1 | 5/2019 | Tsai |
| 2019/0198409 A1 | 6/2019 | Katkar et al. |
| 2019/0199058 A1 | 6/2019 | Pierer et al. |
| 2019/0252364 A1 | 8/2019 | Uzoh et al. |
| 2019/0265411 A1 | 8/2019 | Huang et al. |
| 2019/0326252 A1 | 10/2019 | Mandalapu et al. |
| 2019/0333550 A1 | 10/2019 | Fisch |
| 2019/0358955 A1 | 11/2019 | Giusti et al. |
| 2019/0371761 A1 | 12/2019 | Uzoh et al. |
| 2019/0385935 A1 | 12/2019 | Gao et al. |
| 2019/0385966 A1 | 12/2019 | Gao et al. |
| 2020/0013637 A1 | 1/2020 | Haba |
| 2020/0013754 A1 | 1/2020 | Gao et al. |
| 2020/0013765 A1 | 1/2020 | Fountain, Jr. et al. |
| 2020/0035641 A1 | 1/2020 | Fountain, Jr. et al. |
| 2020/0075520 A1 | 3/2020 | Gao et al. |
| 2020/0075553 A1 | 3/2020 | DeLaCruz et al. |
| 2020/0118973 A1 | 4/2020 | Wang et al. |
| 2020/0126906 A1 | 4/2020 | Uzoh et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0299127 A1 | 9/2020 | Brioschi et al. |
| 2020/0321307 A1 | 10/2020 | Uzoh |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |

FOREIGN PATENT DOCUMENTS

| | | |
|---|---|---|
| CN | 107331759 A | 11/2017 |
| EP | 1011133 A1 | 6/2000 |
| JP | 2002-353416 A | 12/2002 |
| JP | 2008-130603 A | 6/2008 |
| JP | 2008-244080 A | 10/2008 |
| JP | 2009-514185 A | 4/2009 |
| JP | 2011-104633 A | 6/2011 |
| JP | 2013-033786 A | 2/2013 |
| JP | 2015-517217 A | 6/2015 |
| JP | 2016-072316 A | 5/2016 |
| JP | 2018-160519 | 10/2018 |
| TW | 201401573 A | 1/2014 |
| TW | 201423873 A | 6/2014 |

(56) References Cited

FOREIGN PATENT DOCUMENTS

| TW | 201612965 A | 4/2016 |
|---|---|---|
| WO | WO 00/59006 A1 | 10/2000 |
| WO | WO 2005/043584 A2 | 5/2005 |
| WO | WO 2007/021639 A2 | 2/2007 |
| WO | WO 2008/112101 A2 | 9/2008 |
| WO | WO 2009/158378 A2 | 12/2009 |
| WO | WO 2012/133760 A1 | 7/2014 |
| WO | WO 2016/003709 A1 | 1/2016 |
| WO | WO 2018/194827 A1 | 10/2018 |

OTHER PUBLICATIONS

International Search Report dated May 17, 2019 for International Application No. PCT/US2019/015985, 3 pages.

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Moriceau, H. et al., "Overview of recent direct wafer bonding advances and applications," Advances in Natural Sciences—Nanoscience and Nanotechnology, 2010, 11 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (I), 6 pages.

Plobi, A. et al., "Wafer direct bonding: tailoring adhesion between brittle materials," Materials Science and Engineering Review Journal, 1999, R25, 88 pages.

Suga et al., "Bump-less interconnect for next generation system packaging," Electronic Components and Technology Conference, 2001, IEEE, pp. 1003-1008.

Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.

\* cited by examiner

TECHNIQUES FOR PROCESSING DEVICES

PRIORITY CLAIM AND CROSS-REFERENCE TO RELATED APPLICATION

This application is a continuation of U.S. Non-Provisional application Ser. No. 16/919,989, filed Jul. 2, 2020, which is a continuation of U.S. Non-Provisional application Ser. No. 16/262,489, filed Jan. 30, 2019, which claims priority to U.S. Provisional Application No. 62/631,216, filed Feb. 15, 2018, which are hereby incorporated by reference in their entirety.

FIELD

The following description relates to integrated circuits ("ICs"). More particularly, the following description relates to manufacturing IC dies and wafers.

BACKGROUND

Microelectronic elements often comprise a thin slab of a semiconductor material, such as silicon or gallium arsenide, commonly called a semiconductor wafer. A wafer can be formed to include multiple integrated chips or dies on a surface of the wafer and/or partly embedded within the wafer. Dies that are separated from a wafer are commonly provided as individual, prepackaged units. In some package designs, the die is mounted to a substrate or a chip carrier, which is in turn mounted on a circuit panel, such as a printed circuit board (PCB). For example, many dies are provided in packages suitable for surface mounting.

Packaged semiconductor dies can also be provided in "stacked" arrangements, wherein one package is provided, for example, on a circuit board or other carrier, and another package is mounted on top of the first package. These arrangements can allow a number of different dies to be mounted within a single footprint on a circuit board and can further facilitate high-speed operation by providing a short interconnection between the packages. Often, this interconnect distance can be only slightly larger than the thickness of the die itself. For interconnection to be achieved within a stack of die packages, interconnection structures for mechanical and electrical connection may be provided on both sides (e.g., faces) of each die package (except for the topmost package).

Additionally, dies or wafers may be stacked in a three-dimensional arrangement as part of various microelectronic packaging schemes. This can include stacking a layer of one or more dies, devices, and/or wafers on a larger base die, device, wafer, substrate, or the like, stacking multiple dies or wafers in a vertical or horizontal arrangement, and various combinations of both. Dies or wafers may be bonded in a stacked arrangement using various bonding techniques, including direct dielectric bonding, non-adhesive techniques, such as ZiBond® or a hybrid bonding technique, such as DBI®, both available from Invensas Bonding Technologies, Inc. (formerly Ziptronix, Inc.), an Xperi company (see for example, U.S. Pat. Nos. 6,864,585 and 7,485,968, which are incorporated herein in their entirety).

There can be a variety of challenges to implementing stacked die and wafer arrangements. When bonding stacked dies using a direct bonding or hybrid bonding technique, it is usually desirable that the surfaces of the dies to be bonded be extremely flat, smooth, and clean. For instance, in general, the surfaces should have a very low variance in surface topology and have a low level of impurities, particles, or other residue. The removal of particles or residues can improve the cleanliness and flatness of the surfaces and the reliability of the bond between the layers, however, the removal of particles and residue can sometimes be problematic.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternatively, other implementations of devices and/or systems may include additional components, or various combinations of the described components, and remain within the scope of the disclosure.

SUMMARY

Figure 1A:
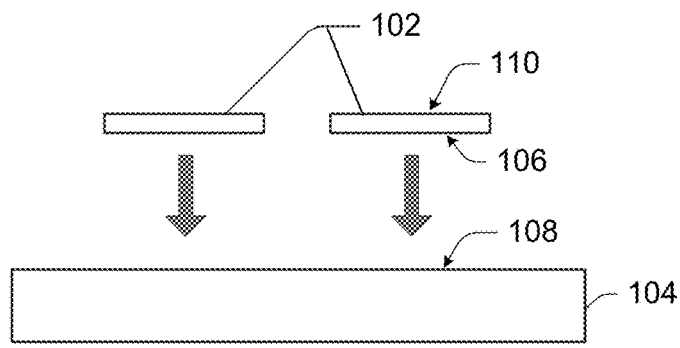
FIG. 1A shows an example profile view of a substrate and two dies prior to bonding the dies to the substrate.

Representative techniques and devices are disclosed, including process steps for forming a novel microelectronic assembly. Processes include preparing microelectronic components such as dies, wafers, substrates, and the like, for bonding. In various implementations, one or more surfaces of the microelectronic components are formed and prepared as bonding surfaces. The microelectronic components may be stacked and bonded without adhesive at the prepared bonding surfaces.

In various implementations, a method for forming a microelectronic assembly includes preparing a bonding surface of a first substrate, including: planarizing the bonding surface of the first substrate to have a first predetermined minimal surface variance and plasma activating the bonding surface of the first substrate. The method further includes preparing a first bonding surface of a second substrate, including planarizing the first bonding surface of the second substrate to have a second predetermined minimal surface variance.

In an implementation, the method includes mounting the second substrate to a dicing sheet or dicing tape held by a dicing frame and singulating the second substrate into a plurality of dies while the second substrate is mounted to the dicing sheet or dicing tape. Each die of the plurality of dies has a first bonding surface comprised of a portion of the first bonding surface of the second substrate.

The method may include processing the plurality of dies while the plurality of dies is mounted to the dicing sheet or dicing tape, selecting a die of the plurality of dies using a pick and place tool, and directly bonding the first bonding surface of the die to the bonding surface of the first substrate without adhesive, and without activating the first bonding surface of the die.

In additional implementations, techniques and methods include preparing a back side of the second substrate or the plurality of dies (or the single die) for bonding an additional die (or multiple additional dies) to the bonded die.

In some implementations, unique sets of processing steps are used to clean the bonding surfaces of the first and/or second substrates, or the die. For example, in some embodiments, one or more unique formulary may be used for cleaning. In other embodiments, a megasonic transducer, and/or a mechanical brush may be used to assist in cleaning.

In an alternate implementation, the bonding surfaces of one or more of the substrates or dies may be coated with one or more protective coatings during processing. For example, in one embodiment, individual protective coatings may render the bonding surfaces hydrophobic or hydrophilic. The coatings may prevent contamination to bonding surfaces, protect against damage to the bonding surfaces during processing, or the like. One or more of the coatings maybe removed during other process steps. Additionally, one or more of the processing tools that handle components may be coated or formed to be hydrophobic as a technique for preventing contamination of clean components during handling.

Various implementations and arrangements are discussed with reference to electrical and electronics components and varied carriers. While specific components (i.e., dies, wafers, integrated circuit (IC) chip dies, substrates, etc.) are mentioned, this is not intended to be limiting, and is for ease of discussion and illustrative convenience. The techniques and devices discussed with reference to a wafer, die, substrate, or the like, are applicable to any type or number of electrical components, circuits (e.g., integrated circuits (IC), mixed circuits, ASICS, memory devices, processors, etc.), groups of components, packaged components, structures (e.g., wafers, panels, boards, PCBs, etc.), and the like, that may be coupled to interface with each other, with external circuits, systems, carriers, and the like. Each of these different components, circuits, groups, packages, structures, and the like, can be generically referred to as a "microelectronic component." For simplicity, unless otherwise specified, components being bonded to another component will be referred to herein as a "die," and the other component that the die is bonded to will be referred to herein as a "substrate."

Implementations are explained in more detail below using a plurality of examples. Although various implementations and examples are discussed here and below, further implementations and examples may be possible by combining the features and elements of individual implementations and examples.

DETAILED DESCRIPTION

Overview

Figure 1B:
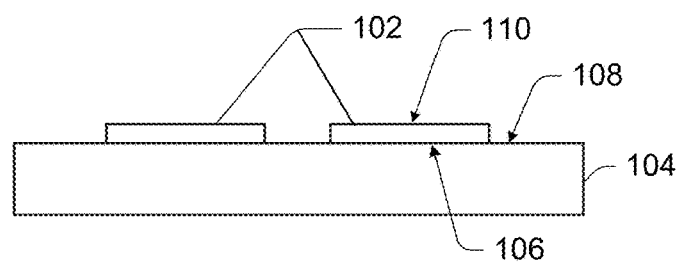
FIG. 1B shows an example profile view of the substrate and the two dies after bonding the dies to the substrate.
Figure 1C:
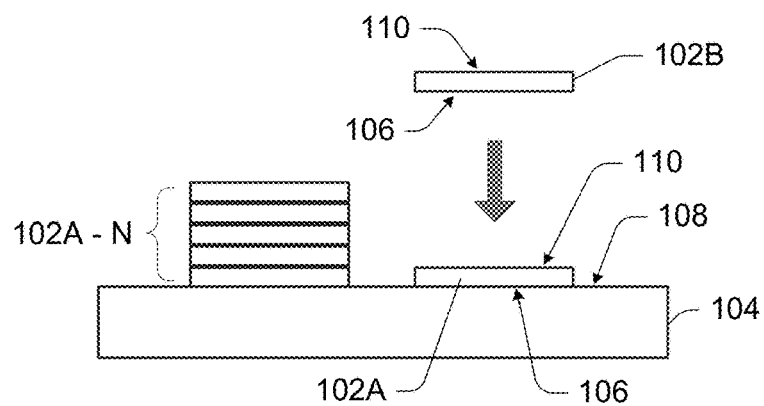
FIG. 1C shows an example profile view of the substrate and bonding multiple dies to the substrate.

Referring to FIGS. 1A-1C, in various examples, techniques for processing devices to be stacked and directly or intimately bonded are disclosed. The disclosure describes example processes that include bonding one or more dies 102 to a substrate 104. However, the processes can also be used to bond wafers to wafers, dies to dies, dies to wafers, and so forth. The diagrams in the accompanying figures show some processes for forming and preparing a substrate 104 (and particularly a bonding surface 108 of a substrate 104) for bonding, and other processes for forming and preparing the one or more dies 102 (and particularly the bonding surfaces 106 and 110 of the dies 102) for bonding to the substrate 104 and to other dies 102. At the end of these processes, the one or more dies 102 are bonded (directly bonded, for example, without an adhesive) to the substrate 104 or to another die 102. The bonding is a spontaneous process that takes place at ambient conditions when the two surfaces (106 and 108 and/or 106 and 110) are brought together. The bonding method results in the formation of chemical bonds having a bond strength of 500-2000 mJ/m$^2$.

Profile views showing example dies 102 and an example substrate 104 are illustrated at FIGS. 1A-1C. FIG. 1A illustrates dies 102 and the substrate 104 prior to bonding, and FIG. 1B shows the dies 102 and the substrate 104 after bonding. FIG. 1C shows bonding multiple dies 102 to the substrate 104, for instance, by stacking and bonding dies 102B to dies 102A, after bonding the dies 102A to the substrate 104. Additional dies 102(C-N) may be stacked and bonded to the dies 102B as desired in like manner.

In various embodiments, an example die 102 or an example substrate 104 can include one or more conductive traces or interconnects (not shown) surrounded by an insulating material (oxide, for example) on the bonding surface (106, 110) of the die 102 or the bonding surface 108 of the substrate 104. For example, a die 102 or a substrate 104 can include multiple conductive and insulating layers (not shown) to determine the function (e.g., memory, processing, programmable logic, etc.) of the die 102 or the substrate 104. Exposed interconnects on the bonding surface (106, 108, or 110) can be electrically continuous with the various conductive layers, and provide an interface for the die 102 or the substrate 104.

When bonding the dies 102 to the substrate 104 (or bonding dies to dies, dies to wafers, wafers to wafers, etc.) using a direct bonding or hybrid bonding technique, it is usually desirable that the surfaces of the dies 102 and substrate 104 to be bonded be extremely flat and smooth. For instance, in general, the bonding surfaces (106 and 108, and 106 and 110) should have a very low variance in surface topology (i.e., nanometer scale variance, for instance below 2 nm and preferably below 0.5 nm), so that the bonding surfaces (106 and 108, and 106 and 110) can be closely mated to form a lasting bond. It is also usually desirable that the bonding surfaces (106 and 108, and 106 and 110) be clean and have a low level of impurities, particles, or other residue that are large enough in size to cause bonding voids that can cause electrical continuity failures or other bonding defects.

For instance, particles and residues remaining from processing steps can result in voids at the bonding interfaces between the stacked dies 102 and the substrate 104. If the voids are substantially smaller than the metallic electrical interconnect size, they may be acceptable. However, particles that cause bonding defects in sizes that are close to or exceed the electrical interconnect size often cannot be tolerated. Also, temporarily bonding dies, wafers, and substrates for processing or handling (e.g., using polymeric or inorganic layers, etc. for temporary bonds) can also be problematic, since the temporary carriers and substrates can leave behind bonding residue when removed, which can persist even after cleaning.

Residue from temporary adhesive layers, which can be comprised of high temperature polymers and the like, can be discontinuous with varying thicknesses on the die surfaces 106 and 110 or the substrate surface 108 (e.g., thickness may range from 10 nm to 50 um). Plasma cleaning, such as ashing with oxygen plasma, can be used to remove thin residue, but even long oxygen plasma ashing steps (e.g., over 40 minutes) may be ineffective to remove the thickest residues. Additionally, long oxygen ashing processes can tend to oxidize the conductive features on the bonding surfaces (106, 110, and/or 108) and reduce the planarity of the cleaned surfaces.

For example, a bonding surface (106, 110, and/or 108) may include recessed conductive features, where the nominal conductive layer recess is about 1 nm to 20 nm below the surface of an adjacent dielectric layer or surface. After long oxygen ashing of the wafer or die surface, the formerly recessed conductive features may change substantially to interfere with bonding or with formation of metal interconnects after bonding. For instance, the formerly recessed conductive features may now protrude over the surface of adjacent dielectric regions. The protrusion of the conductive features may vary from 3 nm to 30 nm in some cases, depending on the ashing process parameters. These conductive asperities over the bonding surface (106, 110, and/or 108) can hinder or prevent intimate mating of bonding layers or surfaces.

In such cases, a high temperature (e.g., over 50° C.) wet process is sometimes used to remove thick residue; however, such a process may not be compatible with other die 102 or substrate 104 layers or materials. For instance, a high temperature wet process can degrade the polished metal layers of the die 102 or substrate 104, reducing device yield. Further, the high temperatures may not be compatible with some die 102 or substrate 104 processing components (e.g., plastic dicing tapes, grip rings, etc.).

In some conventional wafer cleaning processes, wet chemical cleaning solutions, including aggressive cleaning solutions may be effective in removing organic residues from surfaces of wafers. For example, cleaning wafers with mixtures of hydrogen peroxide in a solution of ammonium hydroxides, sulfuric acid, or hydrochloric acids, and their various combinations, at temperatures between 50 and 80° C. can produce pristine wafer surfaces. However, such aggressive cleaning steps would generally be impractical for cleaning the bonding surfaces 106 and 110 of the dies 102, since these aggressive wet chemistries will not only clean the polymeric residues and particles, they may also dissolve large portions of the practical conductive features, which are often comprised of materials such as silver, copper, nickel, and their various alloys.

Representative Processes

FIGS. 2-7B illustrate representative processes 200-750 for forming and preparing microelectronic components (such as dies 102 and substrates 104, for example) for bonding, such as for direct bonding without adhesive. The processes 200-750 include providing a bonding surface (such as bonding surfaces 106, 110, and 108, for example) on the microelectronic components, or two bonding surfaces in some examples (such as bonding surfaces 106 and 110 on a single die 102), planarizing the bonding surfaces, cleaning and activating (in some examples) the bonding surfaces, and the like.

The order in which the processes 200-750 are described is not intended to be construed as limiting, and any number of the described process blocks in any of the processes 200-750 can be combined in any order to implement the processes, or alternate processes. Additionally, individual blocks may be deleted from any of the processes without departing from the spirit and scope of the subject matter described herein. Furthermore, the processes 200-750 can be implemented in any suitable hardware, software, firmware, or a combination thereof, without departing from the scope of the subject matter described herein.

In alternate implementations, other techniques may be included in the processes 200-750 in various combinations and remain within the scope of the disclosure.

Example Technique for Forming and Preparing the Substrate

Figure 2:
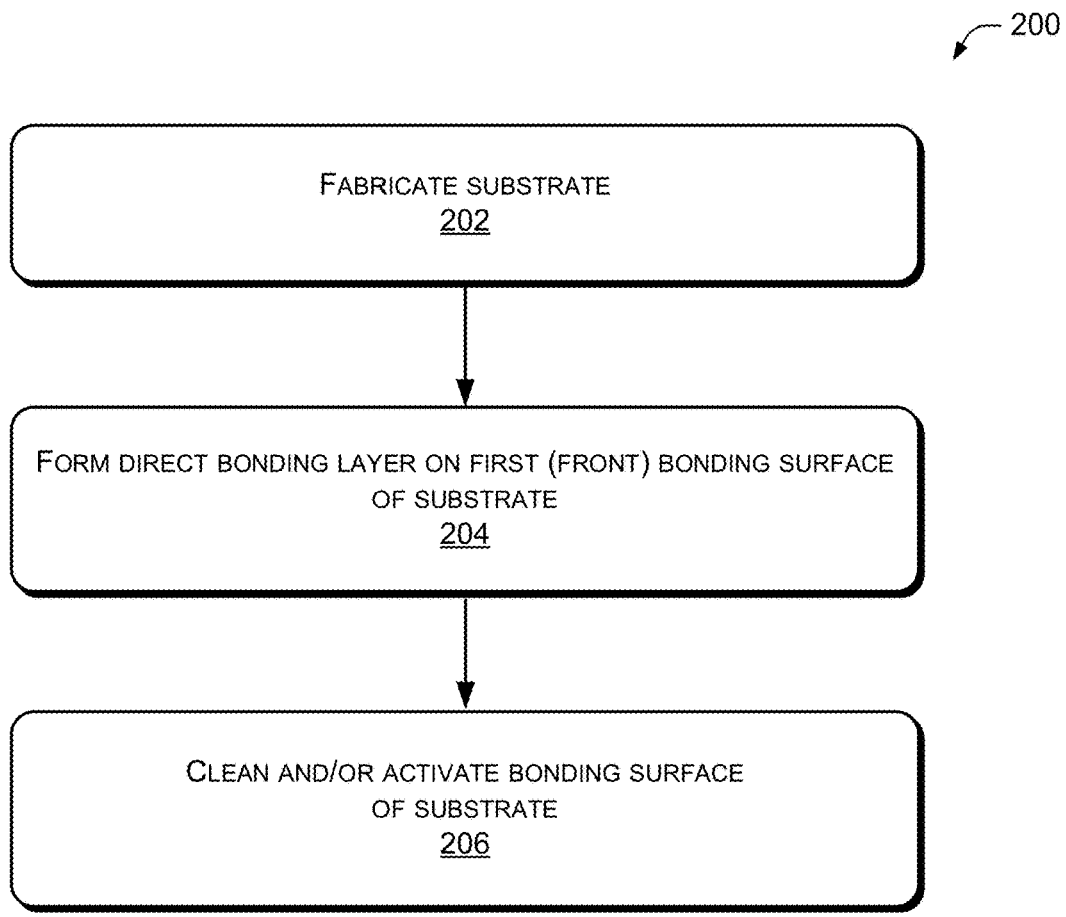
FIG. 2 is a flow diagram illustrating an example process for preparing a substrate for bonding, according to an embodiment.

An example substrate 104 forming process 200 is illustrated at FIG. 2. In various embodiments, the substrate 104 may be comprised of silicon, germanium, a dielectric surface, direct or indirect gap semiconductor materials or layers or another suitable material. At block 202, the process includes fabricating the substrate 104. Briefly, forming the substrate 104 may include fabrication of devices in the substrate 104 such as the front end of the line (FEOL), multilayer backend of the line (BEOL) and other structures of interest, cleaning of the surface of the substrate 104, and so forth.

At block 204, the process includes forming a direct bonding layer on a first (front) surface 108 of the substrate 104. The materials for the bonding layer may be deposited or formed on the first surface 108, and may be comprised of an inorganic dielectric material layer such as oxide, nitride, oxynitride, oxycarbide, carbides, nitrocarbides, diamond, diamond like materials, glasses, ceramics, glass-ceramics, and the like, or a combination of an inorganic dielectric layer and one or more metal features. In some embodiments, the metal features can be recessed from the dielectric surface slightly, e.g., 1 nm to 20 nm below the surface of the dielectric. In some embodiments, forming the direct bonding layer can be incorporated into the wafer fabrication process (such as block 202, for example) as the last metal layer formed. In one embodiment, the planar surface of the last metallized dielectric layer may comprise the bonding surface 108 and additional metallized dielectric coating to form the bonding layer 108 may not be necessary.

Forming the direct bonding layer includes finishing the first surface 108 (i.e., bonding surface) to meet dielectric roughness specifications and metallic layer (e.g., copper, etc.) recess specifications to prepare the surface 108 for direct bonding. In other words, the bonding surface 108 is formed to be as flat and smooth as possible, with very minimal surface topology variance. Various conventional processes, such as chemical mechanical polishing (CMP) may be used to achieve the low surface roughness. The metallic layer may be configured to provide an electrical and/or thermal path or may instead be configured to balance out the metallization, through the use of so-called dummy pads, traces, patterns or the like.

At block 206, the bonding surface 108 of the substrate 104 is cleaned and/or activated in preparation for direct bonding, as described below.

Example Technique for Forming and Preparing the Dies

Figure 3:
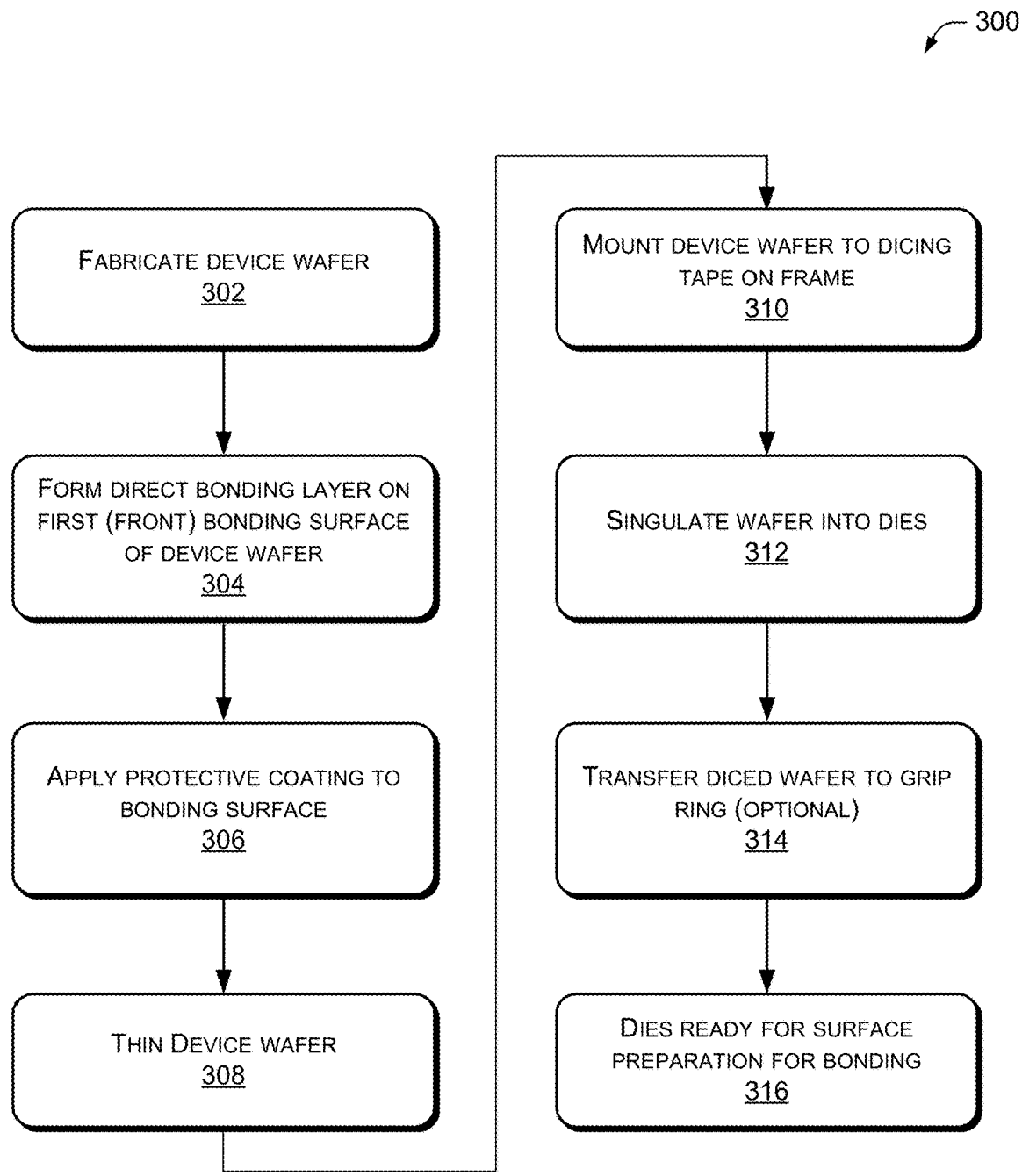
FIG. 3 is a flow diagram illustrating an example process for preparing dies for bonding, according to an embodiment.

FIG. 3 illustrates an example process 300 for forming single-sided or double sided dies 102 from a wafer (which also may be referred to as a "second substrate," and which may be comprised of similar or same materials and formed with similar or same processes and techniques as described above with reference to the substrate 104). In an implementation, the process steps 302 and 304 of fabricating the wafer and forming the (front) bonding surface 106, with the surface topology requirements of the bonding surface, are essentially the same as described above with reference to the substrate 104, at blocks 202 and 204 of process 200.

At block 306, after planarizing the bonding surface 106 of the wafer (e.g., by a CMP process, for example) to achieve a desired topology, a protective coating (such as a resist or other suitable material) is applied to the bonding surface of the wafer to protect the bonding surface 106 against contamination, to protect the exposed metallic layer against corrosion, and to protect the bonding surface 106 during singulation operations, which can tend to generate debris on the front and side surfaces of the dies 102.

Additionally or alternatively, the back surface of the wafer may be processed (e.g. through-die conductor reveal, planarization, etc.), forming a back bonding surface 110 on the dies 102, which may also be coated with a protective coating, or the like.

In some embodiments, more than one type of protective layer may be applied to the wafer surface. For example, the first protective layer may comprise a hydrophobic protective layer and overlying the hydrophobic layer may be a hydrophilic protective layer. In the example, the underlying hydrophobic layer allows for the use of aggressive etching chemicals during cleaning of the side surfaces of the dies 102 and also increases the shelf life of the prepared surfaces 106 and 110. In some cases, the overlying hydrophilic layer receives or is impregnated with particles, debris, dicing tape, adhesive, etc. generated during the dicing process. The hydrophilic layer, along with the particles and debris, is removed. The hydrophobic layer may be temporarily maintained intact to protect the surface 106 (and/or 110) during subsequent processing or storage.

In some instances, as shown at block 308, the wafer is thinned from the non-protected side to achieve a desired thickness. At block 310 the wafer is mounted to a dicing tape on a frame and singulated (block 312) to form the dies 102. The wafer may be singulated into a quantity of dies 102 using a saw, a laser (e.g. stealth laser), a plasma etching process, or other suitable technique. In various examples, the dies 102 are singulated while the wafer is mounted to a dicing sheet or dicing layer or the dicing tape (or the like), held by the frame.

After dicing, the diced wafer on the dicing tape can be expanded and mounted into a grip ring if desired. In various examples, the frame or grip ring may be comprised of plastic parts, metal parts, combinations of the same, and the like. The dicing tape can be any type of dicing tape commonly used in the industry. One example dicing tape includes a UV release tape. In some examples, the dies 102 may be shipped while on the grip ring or dicing frame.

Forming and Preparing the Dies—Double-Sided Die Examples

Figure 4:
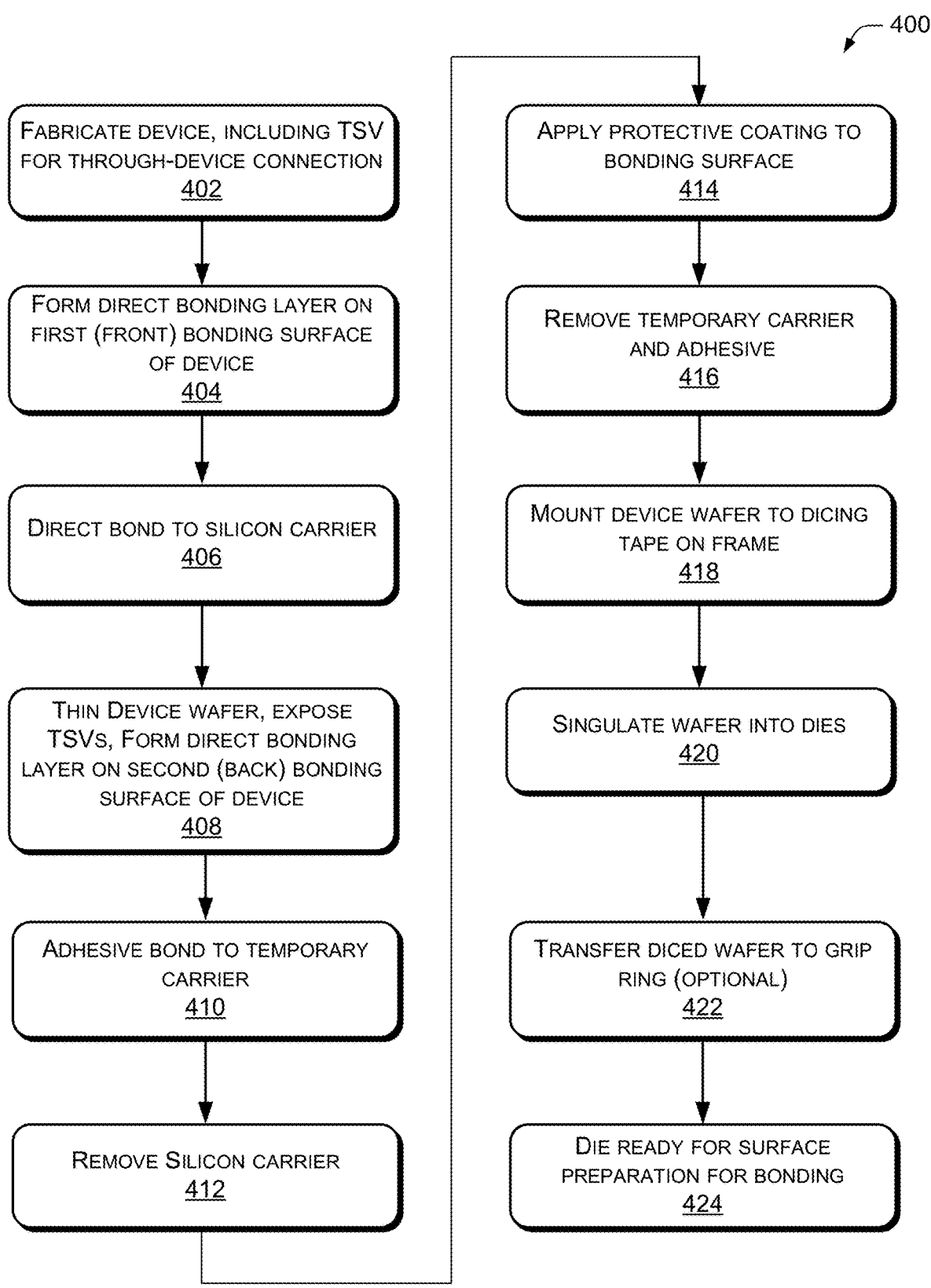
FIG. 4 is a flow diagram illustrating another example process for preparing dies for bonding, according to an embodiment.

FIG. 4 illustrates an example process 400 for forming double-sided dies 102, where both surfaces (106 and 110) of a die 102 will be bonded to substrates 104 or to other dies 102, such as with multiple die-to-die or die-to-wafer applications (as shown in FIG. 1C, for example). At block 402, the process includes fabricating the wafer for the dies 102, which may include fabricating through-silicon-vias (TSVs) at desired locations throughout the dies 102 for future through-device connections. In various embodiments, the wafer may be fabricated from silicon, germanium, or another suitable material.

At block 404, the process includes forming a direct bonding layer on a first (front) surface 106 of the dies 102. The materials for the bonding layer may be deposited or formed on the first surface 106 and may be comprised of an inorganic dielectric material layer or a combination of an inorganic dielectric layer and one or more metal features, as described with reference to FIG. 2. Similarly, as discussed earlier, the planar surface of the last metallized dielectric layer may comprise the bonding surface 106 and additional metallized dielectric coating to form the bonding layer 106 may not be necessary.

Forming the direct bonding layer includes finishing the first surface 106 (i.e., bonding surface) to meet dielectric roughness specifications and metallic layer (e.g., copper, etc.) recess specifications to prepare the surface 106 for direct bonding. In other words, the bonding surface 106 is formed to be as flat and smooth as possible, with very minimal surface topology variance. Various conventional processes, such as chemical mechanical polishing (CMP) may be used to achieve the low surface roughness.

In an implementation, at block 406 the prepared front surface of the wafer to be singulated into dies 102 is directly bonded to a support wafer (e.g., a "silicon carrier" in one example, but carriers of other materials may also be used), for handling the wafer during fabrication of the second (back) bonding surface 110. In one example, the first surface of the wafer is bonded to a silicon wafer using a Zibond direct bonding technique, as described above.

In various embodiments, directly bonding the silicon carrier to the wafer has multiple advantages. For instance, this technique removes any temperature limitations for backside wafer processing. Further, the silicon carrier can have a similar or closely matched coefficient of thermal expansion (CTE), reducing or eliminating warping of the wafer during processing. This can improve the success and reliability of direct bonds with the wafer. Also, directly bonding the silicon carrier enables an ultra-thin wafer to be directly bonded to other dies, wafers, substrates, etc., where it would not be possible otherwise.

At block 408, prior to forming and polishing the second bonding surface 110, the silicon substrate may be thinned, and the TSVs exposed. The second bonding surface 110 of the dies 102, on the back side of the wafer, is formed and finished (as described above) to meet maximum dielectric roughness specifications and metallic layer (e.g., copper, etc.) recess specifications with minimal surface topology variance. Moreover, a protective coating may be applied to the polished second bonding surface 110.

At block 410, the second surface 110 of the wafer may then be bonded to a temporary support wafer using an adhesive, to handle the wafer for front-side 106 processing. At block 412, the silicon support wafer is removed from the first surface 106 of the wafer, using one or more techniques, including etching, dissolving, grinding, or the like. The removal process is performed to ensure that the first surface 106 retains the dielectric layer and any conductive layers for future direct or hybrid bonding after the support wafer has been removed.

At block 414, one or more protective coatings may be applied to the exposed first surface 106. In some embodiments, more than one type of protective layer may be applied to the first surface 106. For example, a first protective layer may comprise a hydrophobic protective layer and overlaying the hydrophobic layer may be a hydrophilic protective layer (as described above).

At block 416, the temporary carrier and temporary bonding adhesive are removed from the back surface 110 of the wafer. At block 418, the finished double-sided wafer is then mounted to a dicing tape on a frame and singulated to form a quantity of double-sided dies 102 (block 420). Optionally, the diced wafer may be transferred to a grip ring (block 422) in preparation for bonding (block 424).

Figure 5:
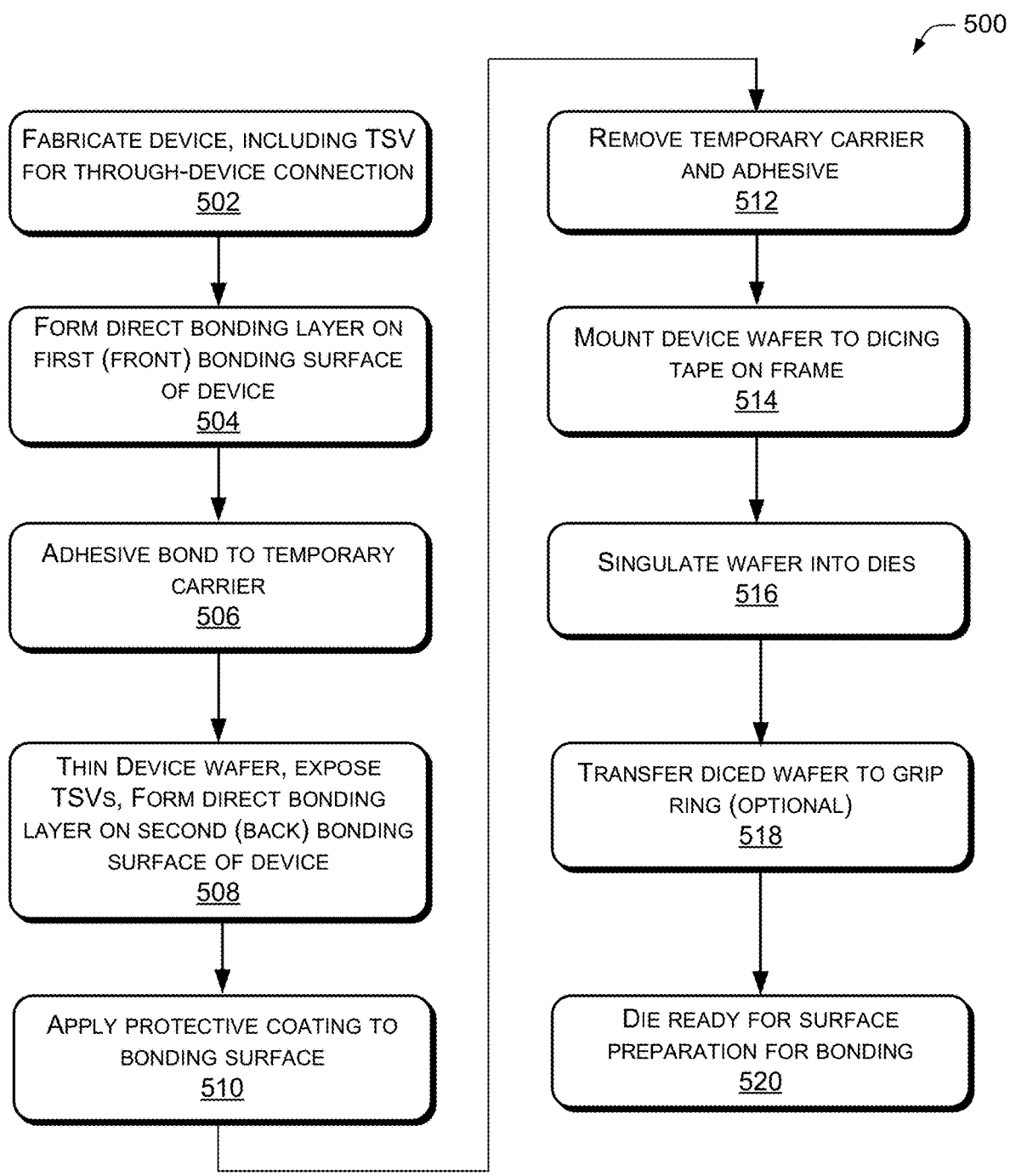
FIG. 5 is a flow diagram illustrating another example process for preparing dies for bonding, according to an embodiment.

Referring to FIG. 5, in an alternate embodiment, illustrated by the process 500, the silicon carrier is not bonded to the wafer using a direct bonding technique. Instead, after fabricating (block 502) and forming/finishing the first bonding surface (block 504) as described above with reference to FIG. 4, the first surface 106 is bonded to a supporting carrier using a temporary bonding adhesive (block 506) for fabrication of the second (back side) 110 bonding surface.

At block 508, the wafer may be thinned as desired, exposing the TSVs. The second bonding layer 110 is formed and finished as described above. At block 510, one or more protective coatings may be applied to the prepared bonding surface(s) (106 and/or 110) prior to dicing. After forming and finishing the second bonding surface 110, the temporary carrier and temporary adhesive material is removed (block 512). The finished double-sided wafer is then mounted to a dicing tape or dicing layer on a frame (block 514), for example, and singulated (block 516) to form a quantity of double-sided dies 102. Optionally, the diced wafer may be transferred to a grip ring (block 518) in preparation for bonding (block 520).

Cleaning and Preparing the Substrate

Figure 6A:
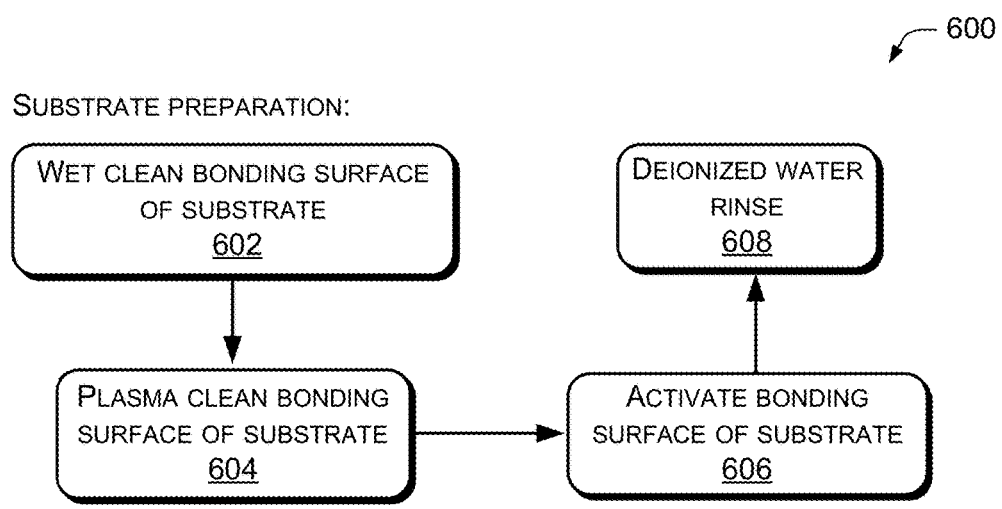
FIG. 6A is a flow diagram illustrating an example process for preparing a substrate for bonding, according to an embodiment.
Figure 6B:
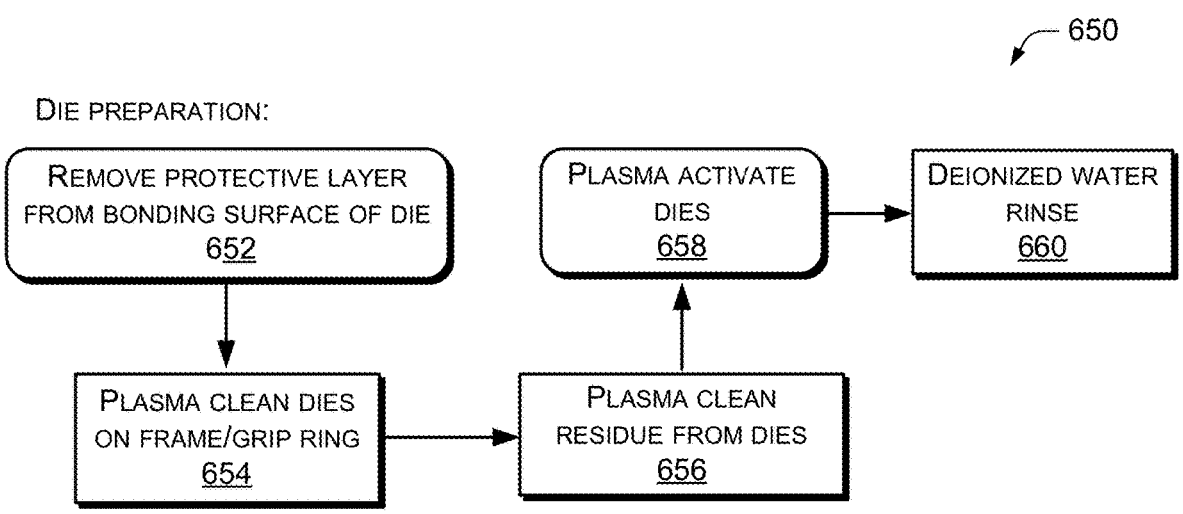
FIG. 6B is a flow diagram illustrating an example process for preparing dies for bonding, according to an embodiment.

The illustrations of FIGS. 6A and 6B show example processes 600 and 650 respectively, describing cleaning and preparing the substrate 104 (process 600) and the dies 102 (process 650) for bonding. Again, although the illustrations (and the associated descriptions) describe bonding dies 102 to a substrate 104, the process can be used to bond wafers to wafers, dies to dies, dies to wafers, and so forth. Moreover, the substrate 104 described in these processes can also refer to the back side 110 of a die 102 already mounted to another die 102 or to a larger substrate, such as a wafer for example.

Referring to FIG. 6A, a process 600 is shown for preparing the bonding surface 108 of the substrate 104. In some embodiments, the process 600 follows or is summarized within block 206 of the process 200 illustrated at FIG. 2. For instance, at block 602, the bonding surface 108 of the substrate 104 is cleaned, for example, with a wet process with solvent. Block 604 follows, including a dry clean process with an oxygen plasma (commonly referred to as ashing) or other plasma chemistry, to remove any inorganic and organic contaminants. The plasma may be provided through an atmospheric, downstream, or reactive ion etching (RIE) process, for instance.

The substrate 104 may then be re-cleaned, including scrubbed with deionized or mildly alkaline water or other suitable solution to remove any particles from the ashing process. At block 606, the bonding surface 108 is activated using a nitrogen plasma process, for example, to prepare the substrate surface 108 for bonding. In various examples, the activation process is known to improve bond strength of the bonded die 102 to the substrate 104. Similarly, the activation step may be provided through an atmospheric, downstream, or reactive ion etching (RIE) process, for example. The substrate 104 may also be rinsed with deionized water to remove particles from the activation process, as shown at block 608.

Cleaning and Preparing the Dies

Referring to FIG. 6B, a process 650 is shown for preparing the first bonding surface 106 of the die(s) 102. In some embodiments, the process 650 follows or is summarized within blocks 316, 424, or 520 from FIGS. 3, 4, and 5, respectively, or the like. For instance, at block 652, preparing the first bonding surface 106 of the dies 102 includes removing the protective layer from the bonding surface 106. At blocks 654 and 656, the bonding surface(s) 106 are cleaned. For example, one or more alternate or optional process stages, including a wet cleaning with a solvent, a dry cleaning with an oxygen plasma (commonly referred to as ashing) or the use of other plasma chemistry, or the like, may be used to remove any inorganic and organic contaminants. The dry cleaning may be performed by a plasma process such as an atmospheric, downstream, or RIE process.

In some cases, the protective layer(s) may be cleaned from the dies 102 while the dies 102 are held on the dicing tape by the frame or grip ring (via a wet process, for example), which also cleans debris resulting from the dicing process. When a UV release tape is used, UV exposure to reduce adhesion strength between the die 102 and the tape to release the die 102 can be performed either before the die cleaning process, or after the die cleaning process, if desired.

In various embodiments, the dies 102 are cleaned with chemicals (e.g., solvents, etchants, water, etc.) that can remove the protective coatings without corroding the metallic layer (e.g., copper) underneath. For example, the cleaning chemicals may include mixtures of hydrogen peroxide in a solution of ammonium hydroxides, or acids. Metal passivating compounds (e.g. triazole moieties) may be used to inhibit metal etching of conductive features such as silver, copper, nickel, and their various alloys. These chemicals and passivating compounds may be cleaned or rinsed from the metal portions of the bonding surface 106.

During the dicing process, particles of the wafer, for example silicon particles, can be embedded in the dicing tape by the mechanical action of the dicing wheel or wire. These embedded particles may contaminate edges and surfaces of the cleaned dies 102, including the bonding surfaces 106, during pick and place direct die transfer from the dicing tape to the bonding layer. Accordingly, it is very important to reduce or eliminate embedded particles from the cleaned bonding surfaces 106. In one example, the dies 102 may be re-mounted onto a sheet of fresh dicing tape of the same or similar material or another suitable material, discarding the original dicing tape. This can be done to remove the embedded contaminants or to enable the use of chemicals that are not compatible with the original dicing tape.

Alternatively, the contaminants trapped in the dicing tape can be removed with more vigorous cleaning of the dies 102, including megasonic shaking, mechanical brushing, and/or a high pressure wash. The vigorous cleaning, including megasonic shaking, mechanical brushing, and high pressure wash also cleans edges of the dies 102 to remove particles and organic contaminants at the edges.

The dies 102 may be dry cleaned with a plasma process such as oxygen plasma and re-cleaned with a wet process while on the dicing tape held by the frame or grip ring, to remove any remaining residue of the protective layer(s) or additional contaminants resulting from some process steps, and to improve the bonding surface 106. However, in some cases, the dicing tape can react with the plasma process and can potentially cause re-contamination of the bonding surface 106 by its reaction products.

In some cases, shielding the exposed tape beyond the die 102 and minimizing the exposed tape between the dies 102 (e.g., using a narrow cutting blade and not stretching the tape) and shortening the plasma process duration can reduce the contamination. In some cases, an oxygen-based reactive ion etching (RIE) plasma process is preferred to shorten the ashing process. In various implementations, a short ashing process in a RIE plasma chamber can cause less surface re-contamination than a long ashing process in a less powerful plasma chamber. The re-cleaning can comprise rinsing the dies 102 with deionized water, which can be combined with mechanical brushing, megasonic shaking, and/or a high pressure wash.

At block 658, the dies 102 may be activated. A nitrogen-based RIE process or downstream plasma method or other plasma cleaning steps including atomic layer cleaning methods can be used to activate the die surface 106 and/or clean any remaining residue or undesirable materials from the surfaces of interest. At block 660, as an option, the dies 102 may be rinsed with deionized water for a final cleaning.

At the end of the die 102 forming and preparation process, the dies 102 may be bonded to the prepared bonding surface 108 of the substrate 104 (as illustrated in FIG. 1B). For a multiple-die 102 stacking arrangement as shown in FIG. 1C, after placing each die 102A on the substrate 104 (or previous die 102N), the second bonding surface 110 (backside) of the placed die 102A may be planarized, cleaned, and activated (in some embodiments as needed and as discussed above) before direct bonding a bonding surface 106 of a next die 102B to the backside surface 110 of the previous die 102A. Any added die 102N may have a prepared bonding surface 106 and/or 110, one or both of which may or may not be activated.

In some cases, the nitrogen-based plasma process can be very reactive with the dicing tape and cause bonding surface contamination, which can negate the benefits of plasma activation. Plasma processes (as used in ashing and activation) can also react with the metal device layer on a die 102 or substrate 104 and change the recess of the metal layer from the dielectric surface. Some of the compounds formed as a result of the interaction of the nitrogen plasma with the polymeric dicing tape may adsorb on the bonding surfaces of interest and contaminate the bonding surfaces (106, 108, and in some embodiments 110).

Consequently, in some embodiments, at least one of the bonding surfaces 106 and/or 110 may not be activated. In some embodiments, a more gentle oxygen or nitrogen plasma of various combinations is preferred to modify the surfaces (106, 108, and in some embodiments 110) when dicing tapes are present or in close proximity. Similarly, the activated surface (106, 108, and in some embodiments 110) may be further cleaned. The cleaning step may comprise a rinse with deionized water, which may be combined with mechanical brushing, megasonic cleaning, and/or a high pressure wash.

In various embodiments, some die process steps may be modified or eliminated, in comparison to the process steps described herein.

Cleaning and Activating Dies on the Pick and Place Tool

In an embodiment, a die 102 is selected by pick and place tools (generally comprising a pick tool and a bonding or placement tool), which may take the die 102 through a cleaning process on the way to placing the die 102 on the prepared substrate 104 for bonding. In an implementation, the dies 102 are activated while on the pick and/or place tools. Such cleaning and activating steps performed while the die 102 is on the tool may be in addition, or as an alternative to, certain of the processes described above, though certain details of the steps described above may be performed in a similar fashion.

As an example, the die 102 may be carried by the pick and place tools through a wet cleaning station, an atmospheric plasma, a laser explosion, or the like, on the way to the substrate 104. In some embodiments, the dies 102 are not rinsed after activation and prior to bonding. In other embodiments, the dies 102 may be rinsed with deionized water, a prepared formulary, or the like, at a process step prior to bonding. In some embodiments, the dies 102 are picked from the dicing tape and flipped by the pick tool to present the back surface 110 of the die 102 to the bonding tool. The face of the pick tool may be in direct contact with the surface 106 to be bonded. The bonding tool head couples to the back side 110 of the die 102, and brings the prepared surface 106 of the die 102 to the prepared surface 108 of the substrate 104 for bonding.

In still other embodiments, the prepared surface 106 of known good dies 102 are picked from the dicing tape and flipped by the pick tool to present the back side 110 of the die 102 to the bonding tool. The face of the pick tool may be in direct contact with the surface 106 to be bonded. The bonding tool head couples to the back side 110 of the die 102 and brings the prepared face 106 of the die 102 (such as die 102B at FIG. 1C) to the exposed prepared surface 110 of known good dies 102 (such as die 102A at FIG. 1C) stacked and bonded to the substrate 104 for bonding.

For instance, after cleaning and activating the second surface 110 of the first die 102A and the first surface 108 of the substrate 104, the prepared first surface 106 of second known good dies 102B may be similarly picked from the dicing layer and bonded to the prepared second surface 110 of the first die 102A. Multiple known good dies 102(A-N) may be stacked over the substrate 104 or over one another, or combinations thereof.

In another embodiment, the prepared dies 102 are picked from the dicing tape and flipped by the pick tool to present the back side 110 of the die 102 to the bonding tool. The bonding tool head couples to the back side 110 of the die 102, and an electrostatic device may be used to remove particulates from the bonding surface 106 prior to attaching the prepared face 106 of the die 102 to the prepared surface 108 of the substrate 104 for bonding. Moreover, the pick and place tool may have a porous surface for contacting the bonding surface.

In other examples, carbon dioxide particles or compressed gas, for example nitrogen, may be applied at a glancing angle to the prepared surface 106 to remove spurious particulates from the prepared surface 106 prior to bonding. In some applications hot compressed gas, for example, hot nitrogen may be applied to remove spurious particles or excess moisture from the prepared surfaces 106 just before the bonding operation. The pressure of the compressed nitrogen may range between 20 to 300 psi and preferably between 50 to 150 psi. Similarly, the temperature of the compressed gas, for example nitrogen, may range between 25 to 100° C. and preferably between 50 and 90° C. The fluid surface cleaning time may range between 2 to 1000 milliseconds and preferably under 200 milliseconds.

Activating One Bonding Surface

In most of the examples above, the prepared surface 108 of the substrate 104 and the prepared surface 106 of the dies 102 are each plasma cleaned (ashing with oxygen plasma is the most common process) and activated prior to bonding the dies 102 to the substrate 104. In certain embodiments, however, just one of these bonding surfaces (e.g., the prepared surface 108 of the substrate 104 or the prepared surface 106 of the dies 102) is plasma cleaned and/or activated prior to bonding the dies 102 to the substrate 104.

In the embodiments, eliminating surface ashing and activation process on either the dies 102 or on the substrate 104 can decrease process related defects and improve yields, as well as reduce costs for forming the bonding surfaces. For instance, eliminating the process steps can result in eliminating contamination of the bonding surface 106 by the dicing tape/plasma interaction product and reducing or eliminating metal loss from wiring layers. Additionally, damage to the dicing frame or grip ring can be minimized so the frame or grip ring life can be extended. Further, throughput can be improved with fewer process steps taken, and with no reduction in bond energy when activating one surface (106, 108) instead of both surfaces (106, 108). Total cost of ownership is reduced with the elimination of plasma chambers for die 102 cleaning as well.

Cleaning and Preparing the Substrate—Alternate Embodiment

Figure 7A:
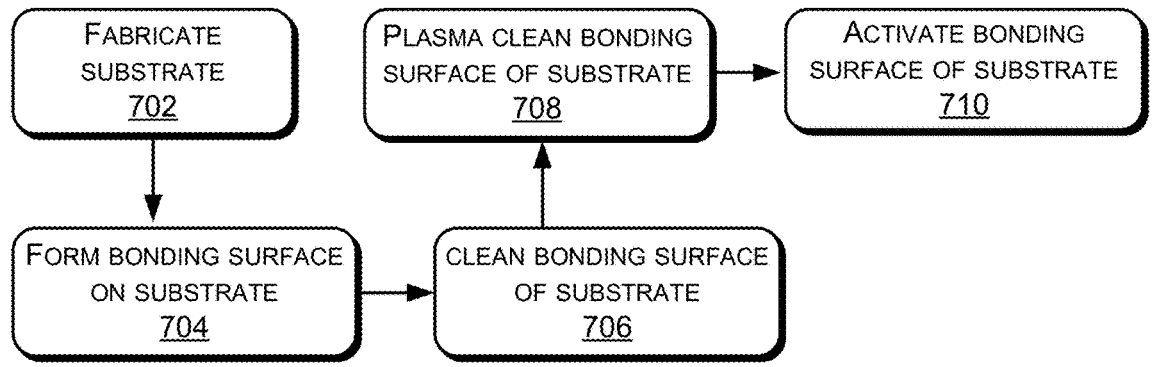
FIG. 7A is a flow diagram illustrating another example process for preparing a substrate for bonding, according to an embodiment.
Figure 7B:
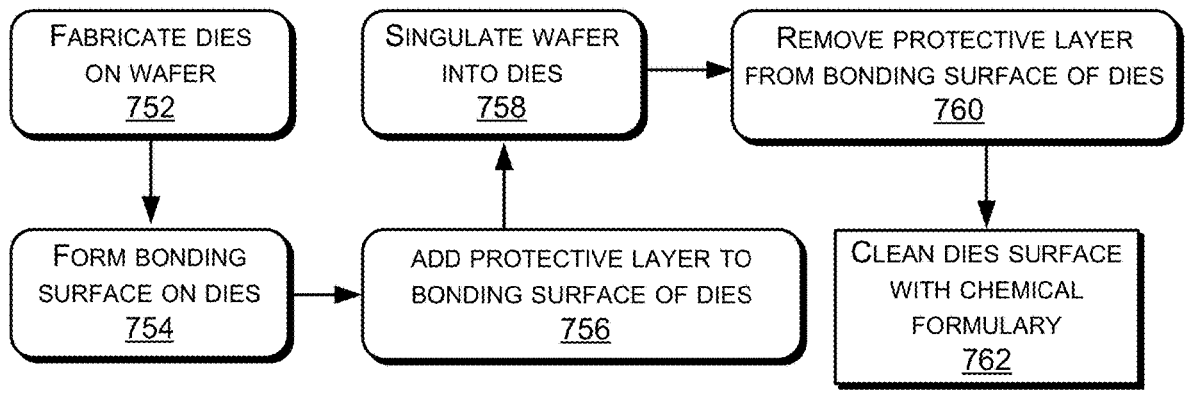
FIG. 7B is a flow diagram illustrating another example process for preparing dies for bonding, according to an embodiment.

The illustrations of FIGS. 7A and 7B show example processes 700 and 750 respectively, describing alternate processes for cleaning and preparing the substrate 104 (process 700) and the dies 102 (process 750) for bonding. Again, although the illustrations (and the associated descriptions) describe bonding dies 102 to a substrate 104, the process can be used to bond wafers to wafers, dies to dies, dies to wafers, and so forth. Moreover, the substrate 104 described in these processes can also refer to the back side of a die 102 already mounted to another die 102 or to a larger substrate, such as a wafer.

Referring to FIG. 7A, a process 700 is shown for preparing the bonding surface 108 of the substrate 104. At block 702, the substrate 104 is fabricated, and a bonding surface 108 is formed on the substrate 104 at block 704, in like manner as described with regard to process 200 at FIG. 2. For example, the bonding surface 108 is prepared for direct bonding without adhesive. In some embodiments as disclosed earlier, fabrication of the substrate 104 may also include forming the bonding surface 108.

At block 706, the bonding surface 108 of the substrate 104 is cleaned, for example, with a wet process with solvent, or the like. Block 708 follows, including a dry clean process with an oxygen plasma (commonly referred to as ashing) or other plasma chemistry, to remove any inorganic and organic contaminants. The plasma may be provided through an atmospheric, downstream, or reactive ion etching (RIE) process, for instance. The substrate 104 may be re-cleaned, including scrubbed with deionized or mildly alkaline water or other suitable solution to remove any particles from the ashing process. In some embodiments, the bonding surface 108 of the substrate 104 may be rendered hydrophobic by cleaning methods, before storing the substrate 104 for subsequent use or before the activation step. At block 710, the bonding surface 108 is activated using a nitrogen plasma process, for example, to prepare the substrate surface 108 for bonding. In various examples, the activation process is known to improve bond strength. The substrate 104 may also be rinsed with deionized water to remove potential contaminating particles from the activation process, if desired.

Cleaning and Preparing the Dies—Alternate Embodiment

Referring to FIG. 7B, a process 750 is shown for preparing the bonding surface(s) 106 and/or 110 of the die(s) 102. At block 752, the dies 102 are fabricated on a wafer, and at block 754 a bonding surface 106 is formed and prepared on a surface of the dies 102, as described previously with regard to process 300 at FIG. 3. For example, the bonding surface 106 is prepared for direct bonding without adhesive. At block 756 one or more protective layers may be added to the bonding surface 106, as also described above, and at block 758, the wafer is singulated into a plurality of dies 102.

At block 760, the process includes removing the protective layer(s) from the bonding surface 106. At block 762, the bonding surface(s) 106 are cleaned using a chemical formulary, as described further below. In some cases, the protective layer(s) may be cleaned from the dies 102 while the dies 102 are held on the dicing tape by the frame or grip ring, which also cleans debris resulting from the dicing process. When a UV release tape is used, UV exposure to reduce adhesion strength between the die 102 and the tape to release the die 102 can be performed either before the die cleaning process, or after the die cleaning process, if desired.

Advantages to the process 750, including cleaning (or other processing) the dies 102 while on the frame or grip ring, or on a polymeric sheet include: elimination of polymeric residue from oxygen and nitrogen plasma steps; reduced processing steps and cycle times for manufacturing; the dies 102 may not need to be activated when the substrate 104 has been activated; the bond energy of the process (including without the die activated) is comparable to a like process where the dies 102 are activated along with the substrate 104 activation; and higher throughput of manufactured devices.

Example Chemical Formulary

Referring to FIG. 7B, after the protective layer is cleaned from the singulated dies 102 (and optionally after the dies 102 are cleaned with a plasma process) the dies 102 may be exposed to a chemical formulary for a predetermined time to clean and prepare the die surface(s) 106 and/or 110 for bonding. In the embodiment, the prepared formulary comprises glycerated diluted hydrofluoric acid or buffered hydrofluoric acid or ammonium fluoride, organic acid, and deionized water, with or without a stabilizing additive. In some embodiments, the formulary may comprise an inorganic or organic acid containing a fluoride ion. It is preferable that the content of the fluoride ion be less than 2% and preferably less than 0.5% and, in some cases, preferably less than 0.1%. Examples of the sources of fluoride ions may include hydrofluoric acid, buffered oxide etch, ammonium fluoride, or tetrabutylammonium fluoride.

The formulary may also comprise aliphatic or non-aliphatic organic acids, and more than one organic acid may be used in the formulary. The organic acid content of the formulary may typically be less than 2% and preferably less than 1%, and preferably less than 0.1%. Examples of organic acid may include formic acid, acetic acid, methyl sulfonic acid and their likes. In some embodiments, mineral acids (for example, a very small amount of sulfuric acid) may be used. However, the amount used should not roughen the surface of the metallic layer at the bonding surface 106.

In various embodiments, glycerol is incorporated into the formulary, where the content of glycerol may vary between 0.5 to 25% of the formulary, and preferably under 10%. In other applications, a very small amount of amide, amines, butylated hydroxyanisole (BHA), butylated hydroxytoulene, or organic carbonates may be added to the formulary. In other embodiments, the formulary may be mildly alkaline with a pH preferably less than 9.5 and preferably less than 8.5. It is preferable that the total content of these additional additives be less than 5% and preferably less than 1%.

It is also desirable that a complexing agent that suppresses the removal or etching or roughening of the surface of the metallic layer at the bonding surface 106 be incorporated into the formulary. In the case of copper, for example, a suitable copper complexing agent with one or more triazole moieties may be used. The concentration of the complexing agent may be less than 2%, and preferably less than 1%, 0.2%, and less than 100 ppm and less than 5 ppm in some instances. After exposure to the formulary, the dies 102 are placed by the pick tool and bonded to the substrate 104, without activation (and optionally without ashing).

After cleaning with the formulary, the dies 102 may be rinsed (for example with deionized water), and may be activated. A nitrogen-based RIE process or downstream plasma method or other plasma cleaning steps including atomic layer cleaning methods can be used to activate the die surface 106 and/or clean any remaining residue or undesirable materials from the surfaces of interest. As an option, the dies 102 may be rinsed with deionized water after activation.

At the end of the die 102 forming and preparation process, the dies 102 may be bonded to the prepared bonding surface 108 of the substrate 104 (as illustrated in FIG. 1B). For a multiple-die stacking arrangement as shown in FIG. 1C, after placing each die 102A on the substrate 104 (or another die 102N), the second bonding surface 110 (backside) of the placed die 102A may be planarized, cleaned, and activated (as needed and as discussed above) before direct bonding a next die 102B to the backside surface 110 of the previous die 102A. Any added die 102(A-N) may have a prepared bonding surface 106 and/or 110, which may or may not be activated.

Forming a Hydrophobic Bonding Surface

In another embodiment, the surface of the dies 102 or substrate 104 or both may be rendered hydrophobic by one or more of the cleaning steps described above. One advantage of rendering the surface (106, 108, and/or 110) itself hydrophobic is that hydrophobic surfaces may be less prone to particulate contamination, and are easily cleaned with compressed fluids such as nitrogen, carbon dioxide or carbon dioxide particles. The bonding surface 106 or 110 of the die 102 (while in the dicing frame, for instance) or the bonding surface 108 of the substrate 104 may be rendered hydrophobic by exposing their non-activated surfaces (106, 108, and/or 110) to the very dilute fluoride containing formularies described above, then rinsing and drying the exposed surface (106, 108, and/or 110). According to this technique, a cleaned, unactivated die 102 with a hydrophobic surface 106 and/or 110 may be attached to the surface 108 of a prepared, activated substrate 104 (or to another die 102) for bonding. Similarly, a cleaned, unactivated substrate 104 with a hydrophobic surface 108 may be bonded to the surface 106 of an activated die 102 or dies 102. Generally, nitrogen activation of a surface (106, 108 and/or 110) tends to render the surface (106, 108 and/or 110) hydrophilic. Annealing the mated surfaces (106, 108 and/or 110) improves the bond energy between the mated materials. Generally, the higher the bonding temperature, the higher the energy need to separate the mated materials.

Additional Process Step Reductions

In a further embodiment, after the protective layer is cleaned from the singulated dies 102, the dies 102 are placed by the pick and place tools and bonded to the substrate 104, without exposure to the formulary, ashing, or activation. In various embodiments, with the substrate 104 activated and the die 102 not activated, the bond energy (or the strength of the bond) of the resulting direct bond is sufficient for the DBI formation process. For instance, in some embodiments, the bond energy is approximately 1000 mJ/m$^2$, which meets minimum bond energy requirements for a suitable direct bond according to some specifications. Further, elimination of certain oxygen and nitrogen RIE steps eliminates the dicing tape/plasma reaction by-products which can deposit on the die 102 surface, as well as the cost and time of additional process steps.

Annealing

As a final step in the bonding process for all of the embodiments discussed, the die 102 and substrate 104 may be heated above ambient temperature (annealed) to form the metal-to-metal joint. In these embodiments, the high temperature of the annealing process causes the metal (e.g., Cu) in the bonding layer (106, 108 and/or 110) to expand more than the dielectric material (e.g. oxide) surrounding the metal. The deferential in CTE allows the metallic layer(s), which may be recessed below the bonding surface (106, 108 and/or 110) at room temperature, to expand to bridge the gap between the two mating surfaces of the dielectric materials and form electrically conductive joints during the anneal.

In one embodiment, a multi-die stack is not annealed after each die 102 is placed, but instead the whole stack is annealed once all of the dies 102 of the stack are placed. Alternatively, a low temperature anneal may be used after each die 102 is placed. Further, the back surface 110 of the bonded die 102 is cleaned and prepared to accept an additional cleaned die 102 or die stack. The substrate 104 with a multi-die stack may be thermally annealed at a higher temperature for the opposing metal features at the various bonding interfaces to mate intimately.

In some embodiments, after disclosed processes, the substrate 104 may be singulated by known methods to form a new structure comprising of dies 102, directly bonded to a smaller singulated substrate 104 (not shown). In one embodiment, a bonding surface area of a die 102 is smaller than the bonding surface of the singulated substrate 104.

Pick and Place Tool Preparation

In various implementations, the pick and place tools are designed or treated to minimize the opportunities to contaminate the dies 102. The pick and place tools (or portions of them) may be formed from a material (or coated with a material) selected for desired hydrophobic properties. For instance, the tools may be coated with a material such as polytetrafluoroethylene (PTFE), or another hydrophobic material.

Also, the tools may be prepared (e.g., with a structural design, with a predetermined treatment, etc.) to be resistant to contaminants or to avoid passing contaminants to the dies 102. As such, the face pick process (e.g., picking the dies 102 at the prepared bonding surface 106 and/or 110) does not degrade bonding quality while picking from the die surface 106 and/or 110 to be bonded. Alternatively, the surface 106 and/or 110 of the die 102 can be chemically treated to have hydrophobic properties to minimize particles sticking to the surface 106 and/or 110 from the pick tool. Also, at desirable intervals, the surface of the pick and place tool can be cleaned to remove potential sources of die surface contaminants. One or more surfaces of the tool may be porous.

The techniques, components, and devices described herein are not limited to the illustrations of FIGS. 1A-7B, and may be applied to other designs, types, arrangements, and constructions including with other electrical components without departing from the scope of the disclosure. In some cases, additional or alternative components, techniques, sequences, or processes may be used to implement the techniques described herein. Further, the components and/or techniques may be arranged and/or combined in various combinations, while resulting in similar or approximately identical results.

Conclusion

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A method of forming a microelectronic assembly, the method comprising:
preparing a bonding surface of a first substrate;
preparing a bonding surface of a second substrate;
mounting the second substrate to a dicing support structure;
singulating the second substrate into a plurality of dies while the second substrate is mounted to the dicing support structure, each die of the plurality of dies having a bonding surface comprising a portion of the bonding surface of the second substrate;
activating the bonding surface of the first substrate; and
directly bonding the bonding surface of a die of the plurality of dies to the bonding surface of the first substrate without an adhesive,
wherein the bonding surface of the die is not activated before directly bonding and while the die is mounted to the dicing support structure.

2. The method of claim 1, wherein the dicing support structure comprises a dicing tape.

3. The method of claim 1, further comprising processing the plurality of dies while the plurality of dies is mounted to the dicing support structure, the processing including cleaning the bonding surface of the dies.

4. The method of claim 3, wherein activating the bonding surface of the first substrate comprises activating the bonding surface of the first substrate with a first plasma.

5. The method of claim 4, wherein processing the plurality of dies comprises cleaning the bonding surface of the dies with a non-activating second plasma different from the first plasma.

6. The method of claim 5, wherein the first plasma comprises a nitrogen plasma.

7. The method of claim 6, wherein the second plasma comprises an oxygen plasma.

8. The method of claim 3, further comprising applying a protective coating to the bonding surface of the second substrate prior to singulating the second substrate.

9. The method of claim 8, wherein cleaning the bonding surface of the dies comprises removing the protective coating from the bonding surface of the dies, after the singulating.

10. The method of claim 1, further comprising picking up the die by contacting the bonding surface of the die with a bonding tool.

11. The method of claim 10, further comprising:
contacting a back surface of the die with a bonding tool, the back surface opposite the bonding surface of the die; and
directly bonding the bonding surface of the die to the bonding surface of the first substrate with the bonding tool.

12. The method of claim 1, wherein directly bonding the bonding surface of the die to the bonding surface of the first substrate comprises directly bonding the bonding surface of the die to the bonding surface of a wafer.

13. The method of claim 1, wherein directly bonding the bonding surface of the die to the bonding surface of the first substrate comprises directly bonding the bonding surface of the die to the bonding surface of a second die.

14. The method of claim 1, wherein directly bonding the bonding surface of the die to the bonding surface of the first substrate without an adhesive comprises hybrid bonding the bonding surface of the die to the bonding surface of the first substrate.

15. The method of claim 1, wherein:
the bonding surface of the first substrate comprises a first conductive feature and a first insulating region at least partially surrounding the first conductive feature,
the bonding surface of each die of the plurality of dies comprises a second conductive feature and a second insulating region at least partially surrounding the second conductive feature, and
directly bonding the bonding surface of the die to the bonding surface of the first substrate without an adhesive comprises directly bonding the first conductive feature to the second conductive feature without an adhesive and directly bonding the first insulating region to the second insulating region without an adhesive.

16. The method of claim 1, wherein directly bonding the bonding surface of the die to the bonding surface of the first substrate without an adhesive comprises using a dielectric-to-dielectric direct bonding technique to directly bond the bonding surface of the die to the bonding surface of the first substrate.

17. The method of claim 1, wherein directly bonding the bonding surface of the die to the bonding surface of the substrate without an adhesive comprises forming a hybrid bond between the bonding surface of the die to the bonding surface of the first substrate.

18. The method of claim 1, wherein directly bonding the bonding surface of the die to the bonding surface of the first substrate without an adhesive comprises forming a direct bond having a bond energy of at least 1000 mJ/m$^2$.

19. The method of claim 1, wherein directly bonding the bonding surface of the die to the bonding surface of the first substrate without an adhesive comprises forming a chemical bond.

20. A method of forming a microelectronic assembly, the method comprising:
preparing a first bonding surface of a first substrate;
contacting a second bonding surface of a die with a first bonding tool and removing the die from a support;
contacting a back surface of the die with a second bonding tool, the back surface opposite the second bonding surface;
activating only one of the first bonding surface and the second bonding surface; and
using the second bonding tool to directly bond the first bonding surface of the first substrate to the second bonding surface of the die without an adhesive and without activating the other of the first bonding surface and the second bonding surface.

21. The method of claim 20, further comprising preparing a bonding surface of a second substrate, and, after preparing the bonding surface of the second substrate, mounting the second substrate to the support and singulating the second substrate into a plurality of dies, the plurality of dies comprising the die.

22. The method of claim 21, further comprising processing the plurality of dies while the plurality of dies is mounted to the support, including cleaning the bonding surface of the dies.

23. The method of claim 22, wherein activating comprises activating the first bonding surface of the first substrate with a first plasma, and wherein processing the plurality of dies comprises cleaning the bonding surface of the dies with a non-activating second plasma different from the first plasma.

24. The method of claim 23, wherein the first plasma comprises a nitrogen plasma, and wherein the second plasma comprises an oxygen plasma.

25. The method of claim 21, further comprising applying a protective coating to the bonding surface of the second substrate prior to singulating the second substrate.

26. The method of claim 25, further comprising removing the protective coating before direct bonding.

27. The method of claim 20, wherein using the second bonding tool to directly bond the first bonding surface to the second bonding surface without an adhesive comprises using the second bonding tool to hybrid bond the first bonding surface to the second bonding surface.

28. The method of claim 20, wherein:
the first bonding surface comprises a first conductive feature and a first insulating region at least partially surrounding the first conductive feature,
the second bonding surface comprises a second conductive feature and a second insulating region at least partially surrounding the second conductive feature, and
using the second bonding tool to directly bond the first bonding surface to the second bonding surface without an adhesive comprises using the second bonding tool to directly bond the first bonding surface to the second bonding surface such that the first conductive feature is directly bonded to the second conductive feature without an adhesive and the first nonconductive region is directly bonded to the second nonconductive region without an adhesive.

29. The method of claim 20, wherein using the second bonding tool to directly bond the first bonding surface of the first substrate to the second bonding surface of the die without an adhesive comprises using the second bonding tool to form a dielectric-to-dielectric direct bond between the first bonding surface of the first substrate and the second bonding surface of the die.

30. The method of claim 20, wherein using the second bonding tool to directly bond the first bonding surface of the first substrate to the second bonding surface of the die without an adhesive comprises using the second bonding tool to form a hybrid direct bond between the first bonding surface of the first substrate and the second bonding surface of the die.

31. The method of claim 20, wherein using the second bonding tool to directly bond the first bonding surface of the first substrate to the second bonding surface of the die without an adhesive comprises using the second bonding tool to form a direct bond having a bond energy of at least 1000 mJ/m$^2$ between the first bonding surface of the first substrate and the second bonding surface of the die.

32. The method of claim 20, wherein using the second bonding tool to directly bond the first bonding surface of the first substrate to the second bonding surface of the die without an adhesive comprises using the second bonding tool to form a chemical bond between the first bonding surface of the first substrate and the second bonding surface of the die.

* * * * *